US005587961A

United States Patent [19]
Wright et al.

[11] Patent Number: 5,587,961
[45] Date of Patent: Dec. 24, 1996

[54] SYNCHRONOUS MEMORY ALLOWING EARLY READ COMMAND IN WRITE TO READ TRANSITIONS

[75] Inventors: Jeffrey P. Wright; Hua Zheng, both of Boise, Id.

[73] Assignee: Micron Technology, Inc., Boise, Id.

[21] Appl. No.: 601,290

[22] Filed: Feb. 16, 1996

[51] Int. Cl.$^6$ ........................................ G11C 8/00
[52] U.S. Cl. ...................... 365/233; 365/233.5; 365/235; 365/238.5
[58] Field of Search ........................ 365/233, 233.5, 365/235, 238.5

Primary Examiner—David C. Nelms
Assistant Examiner—F. Niranjan
Attorney, Agent, or Firm—Schwegman, Lundberg, Woessner & Kluth, P.A.

[57] ABSTRACT

A synchronous random access memory, such as a synchronous dynamic random access memory or a synchronous graphic random access memory, is responsive to command signals and includes a bank memory array. A command decoder/controller responds to command signals to initiate, in a first system clock cycle, a burst write command controlling a burst write operation to transfer multiple input data sets to the bank memory array. When the synchronous random access memory is programmed with a read latency of three or more, the command decoder/controller responds to command signals to initiate, in a second system clock cycle, a read command controlling a read operation to transfer at least one output data set from the bank memory array. One of the multiple input data sets transferred during the write operation is input into the memory device during the second system clock cycle.

15 Claims, 7 Drawing Sheets

SYNCHRONOUS MEMORY ALLOWING EARLY READ COMMAND IN WRITE TO READ TRANSITIONS

THE FIELD OF THE INVENTION

The present invention relates to semiconductor memory integrated circuits and, more particularly to synchronous random access memories such as synchronous dynamic random access memories and synchronous graphic random access memories.

BACKGROUND OF THE INVENTION

Synchronous random access memories such as a synchronous dynamic random access memories (SDRAMs) and a synchronous graphic random access memories (SGRAMs) are designed to operate in a synchronous memory system. Thus, all input and output signals, with the exception of a clock enable signal during power down and self refresh modes, are synchronized to an active edge of a system clock.

SDRAMs offer substantial advances in dynamic memory operating performance. For example, some SDRAMs are capable of synchronously providing burst data in a burst mode at a high-speed data rate by automatically generating a column address to address a memory array of storage cells organized in rows and columns for storing data within the SDRAM. In addition, if the SDRAM includes two or more banks of memory arrays, the SDRAM preferably permits interleaving between the two or more banks to hide precharging time. SGRAMs differ from SDRAMs by providing certain column block write functions and masked write or write-per-bit functions to accommodate high-performance graphics applications.

In an asynchronous DRAM, once row and column addresses are issued to the DRAM and a row address strobe signal and column address strobe signal are deactivated, the DRAM's memory is precharged and available for another access. Another row cannot be accessed in the DRAM array, however, until the previous row access is completed.

By contrast, a SDRAM requires separate commands for accessing and precharging a row of storage cells in the SDRAM memory array. Once row and column addresses are provided to a SDRAM in a SDRAM having multiple bank memory array's, a bank memory array which is accessed remains active. An internally generated row address strobe remains active and the selected row is open until a PRECHARGE command deactivates and recharges the selected row of the memory array.

In a SDRAM, a transfer operation involves performing a PRECHARGE command operation to deactivate and recharge a previously accessed bank memory array, performing an ACTIVE command operation to register the row address and activate the bank memory array to be accessed in the transfer operation, and performing the transfer READ or WRITE command to register the column address and initiate a burst cycle.

Read latency, such as one, two, or three clock cycles, is typically a programmable feature of SDRAMs and SGRAMs which guarantees which clock the data will be available, regardless of clock rate. Data can be made available on an output up to one clock less than the read latency, depending on the frequency of the system clock. In the art of memory design, read latency is sometimes referred to as column address strobe (CAS) latency.

In current SDRAMs and SGRAMs, when a write burst operation is followed by a READ command, a NOP command must be asserted during the transferring of the last data set of the burst write operation prior to issuing the READ command. There is a need to speed up the transition from a burst WRITE operation to a READ operation for certain higher read latencies required to accommodate systems employing SDRAMs or SCRAMs, which operate with faster clock frequencies.

SUMMARY OF THE INVENTION

The present invention provides a memory device responsive to command signals and operating in synchronization with active edges of a system clock. A bank memory array includes storage cells organized in rows and columns for storing data. A command decoder/controller is responsive to selected command signals to initiate, at a first active edge of the system clock, a burst write command controlling a burst write operation to transfer multiple input data sets to the bank memory array. The command decoder/controller is responsive to selected command signals to initiate, at a second active edge of the system clock, a read command controlling a read operation to transfer at least one output data set from the bank memory array. Each input and output data set includes at least one bit of data. One of the multiple input data sets transferred during the write operation is input into the memory device during a second system clock cycle beginning with the second active edge.

In one preferred embodiment of the present invention, the memory device is a synchronous dynamic random access memory (SDRAM). In another preferred embodiment of the present invention, the memory device is a synchronous graphic random access memory (SGRAM). The SDRAM or SGRAM of the present invention preferable includes a programmable mode register for storing defined mode information. The command controller is allowed to initiate the read command at the second active edge of the system clock based on the mode information.

The mode information preferably includes a read latency number. When the read latency number is at least three clock cycles, the command controller is allowed to initiate the read command at the second active edge of the system clock. When the read latency number is three clock cycles, the one of the multiple input data sets input into the memory device during the second system clock cycle is the last data set transferred during the write operation. When the read latency number is four clock cycles, the one of the multiple input data sets input into the memory device during the second system clock cycle is the last or second to last data set transferred during the write operation. When the read latency number is one or two clock cycles, the command controller is not allowed to initiate the read command until after the second system clock cycle.

For read latencies of at least three, the present invention speeds up the transition from a burst write operation to a read operation by one or more clock cycles. In fact, unlike previous SDRAMs and SGRAMs, the SDRAM or SGRAM according to the present invention performs a WRITE to READ transition for a read latency of three to produce output read data in the same number of clock cycles from the end of the write operation as with a WRITE to READ transition for a read latency of two.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
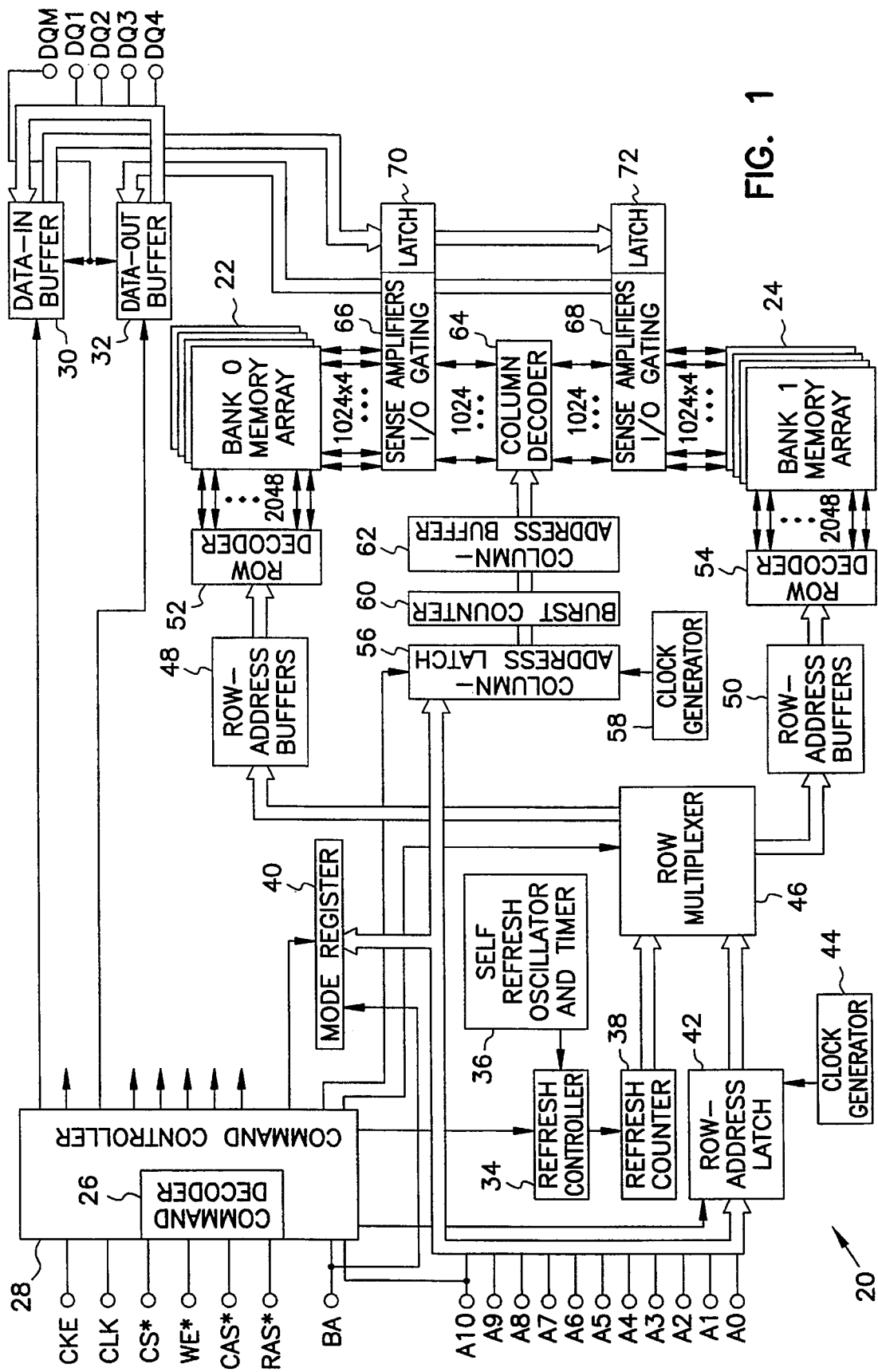
FIG. 1 is a block diagram of a SDRAM according to the present invention.

A synchronous dynamic random access memory (SDRAM) according to the present invention is illustrated generally at 20 in FIG. 1 in block diagram form. Much of the circuitry of SDRAM 20 is similar to circuitry in known SDRAMs, such as the Micron Technology, Inc. MT48LC4M4R1 S 4 MEG×4 SDRAM, which is described in detail in the corresponding Micron Technology, Inc. Functional Specification, which is incorporated herein by reference.

The present invention is not limited to SDRAMs, as the present invention is equally applied to other synchronous random access memories devices such as a synchronous graphics random access memory (SGRAM). The operation of a SGRAM according to the present invention is similar to the operation of a SDRAM. Thus, a SGRAM is not illustrated in the drawings. SGRAMs differ from SDRAMs by providing certain column block write functions and masked write or write-per-bit functions to accommodate high-performance graphics applications Much of the circuitry of a SGRAM according to the present invention is similar to circuitry in known SGRAMs, such as the Micron Technology, Inc. MT41LC256K32D4(S) 256K×32 SGRAM, which is described in detail in the corresponding Micron Technology, Inc. 1995 DRAM Data Book, and which is incorporated herein by reference.

As illustrated in FIG. 1, SDRAM 20 includes a bank 0 memory array 22 and of bank 1 memory array 24 which both comprise storage cells organized in rows and columns for storing data. In one embodiment of SDRAM 20, each bank memory array comprises four separate arrays of 2048 rows× 1024 columns.

Power is supplied to SDRAM 20 pins Vcc and Vss. A typical SDRAM 20 provides optimum memory performance in a low voltage environment such as a 3.3 V environment. A system clock (CLK) signal is provided through a CLK input pin and a clock enable signal (CKE) is provided through a CKE input pin to SDRAM 20. The CLK signal is activated and deactivated based on the state of the CKE signal. All the input and output signals of SDRAM 20, with the exception of the CKE input signal during power down and self refresh modes, are synchronized to the active going edge (the positive going edge in the embodiment illustrated in FIG. 1) of the CLK signal.

A chip select (CS*) input pin inputs a CS* signal which enables, when low, and disables, when high a command decode 26. Command decode 26 is included in a command controller 28. Command decoder 26 receives control signals including a row address strobe (RAS*) signal on a RAS* pin, column address strobe (CAS*) signal on a CAS* pin, and a write enable (WE*) signal on a WE* pin. Command decoder 26 decodes the RAS*, CAS*, and WE* signals to place command controller 28 in a particular command operation sequence. Command controller 28 controls the various circuitry of SDRAM 20 based on decoded commands such as during controlled reads or writes from or to bank 0 memory array 22 and bank 1 memory array 24. A bank address (BA) signal is provided on a BA input pin to define which bank memory array should be operated on by certain commands issued by command controller 28.

Address inputs bits are provided on input pins A0–A10. As described below, both the row and column address input bits are provided on the address input pins. During write transfer operations, data is supplied to SDRAM 20 via input/output pins (DQ1–DQ4). During read transfer operations, data is clocked out of SDRAM 20 via input/output pins DQ1–DQ4. An input/output mask signal is provided on a DQM input pin to provide non-persistent buffer control for a data-in buffer 30 and a data-out buffer 32.

SDRAM 20 must be powered-up and initialized in a predefined manner. In addition, both bank 0 and bank 1 memory arrays 22 and 24 must be precharged and placed in an idle state. The precharging of the bank memory arrays is preformed with a precharge command operation which is described in more detail below. Once in the idle state, two AUTO-REFRESH operations must be performed. Two refresh commands are typically available in SDRAM 20 which are an AUTO-REFRESH command and a SELF-REFRESH command. The AUTO-REFRESH and SELF-REFRESH commands are performed with refresh controller 34, self-refresh oscillator and timer 36, and refresh counter 38 in a manner known in the art to refresh the memory arrays. Once the two AUTO-REFRESH operations are performed, SDRAM 20 is available for programming of a mode register 40. Mode register 40 is assumed to have an unknown state when SDRAM 20 is powered up. Consequently, before performing any operational command, mode register 40 must be set or programmed.

Mode register 40 is typically a persistent register wherein once programmed, the mode register retains the program op-code until the mode register is reprogrammed or SDRAM 20 loses power. Most of the possible programmable options of SDRAM 20 are defined in the op-codes stored in mode register 40. Typically mode register 40 is programmed by providing a desired op-code via the BA input pins and the A0–A10 address inputs, in conjunction with a SET MODE REGISTER command determined by CS*, RAS*, CAS*, and WE* being registered low.

A valid ACTIVE command is initiated by command controller 28 with the CS* and RAS* signals low with the CAS* and WE* signals high on a rising edge of the CLK signal. During the ACTIVE command the state of the BA signal determines which bank memory array to activate and address. During the ACTIVE command a value representing a row address of the selected bank memory array, as indicated by address bits on input pins A0–A10, is latched in a row address latch 42 in response to a clock signal generated from a clock generator circuit 44. The latched row address is provided to a row multiplexer 46 which provides a row address to row address buffers 48 to be provided to bank 0 memory array 22 or row address buffers 50 to be provided to bank 1 memory array 24 depending on the state of the BA signal. A row decoder 52 decodes the row address provided from row address buffers 48 to activate one of the 2,048 lines corresponding to the row address for read or write transfer operations, to thereby activate the corresponding row of storage cells in bank 0 memory array 22. Row decoder 54 similarly decodes the row address in row address buffer 50 to activate one of the 2,048 lines to bank 1 memory array 24 corresponding to the row address for read or write transfer operations, to thereby activate the corresponding row of storage cells in bank 1 memory array 24. In order to access a row once a row in the selected bank memory has been activated with the ACTIVE command, a bank memory array must be precharged with the below described PRECHARGE command or AUTO-PRECHARGE command before another ACTIVE command is applied to the bank memory array.

A valid READ command is initiated with the CS* and CAS* signals low, and the RAS* and WE* signals high on a rising edge of the CLK signal. The READ command from command controller 28 controls a column address latch 56 which receives address bits A0–A9 and holds a value representing a column address of the bank memory array selected by the BA signal at the time the READ command is initiated. Column address latch 56 latches the column address in response to a clock signal generated by a clock generator 58. Address pin A10 provides an input path for a command signal which determines whether or not an AUTO-PRECHARGE command, described in detail below, is to be initiated automatically after the READ command. The READ command provided from command controller 28 also initiates a burst read cycle, described in detail below, by starting a burst counter 60.

A column address buffer 62 receives the output of the burst counter 60 to provide the current count of the column address to a column decoder 64. Column decoder 64 activates four of the 1,024×4 lines, provided to sense amplifiers and input/output (I/O) gating circuit 66 and sense amplifiers and I/O gating circuit 68 corresponding to the current column address. Sense amplifiers and I/O gating circuits 66 and 68 operate in a manner known in the art to sense the data stored in the storage cells addressed by the active row decoder line and the active column decoder lines to provide the selected four bit byte of data from either bank 0 memory array 22 or bank 1 memory array 24 respectively to data-out buffer 32 during a read operation. Data-out buffer 32 provides the selected four bit byte of data to input/output data pins DQ1–DQ4.

In a burst read having a length of four, the initial column address stored in column address latch 56 is used to activate sense amplifiers and I/O gating circuits 66 or 68 during the first burst cycle of the burst read operation. Then, during the next three clock cycles burst counter 60 counts up from the column address stored in column address latch 56, as defined by a sequence type, to "burst" or clock-out the next three memory locations of data. A full-page burst will wrap around and continually restart the "burst" operation until a BURST TERMINATION command or PRECHARGE command is indicated by command controller 28 or until interrupted with another burst operation.

A valid WRITE command is initiated with the CS*, CAS*, and WE* signals low and the RAS* signal high on the rising edge of the CLK signal. The WRITE command provided from command controller 28 controls clock generator 58 to clock column address latch 56 which receives and holds a value representing a column address of the bank memory array selected by the state of the BA signal at the time the WRITE command is initiated, as indicated by the address provided on address input pins A0–A9. As with the read operation, during the WRITE command, address pin A10 provides the additional feature to select whether or not the below described AUTO-PRECHARGE command is to be initiated following the WRITE command. Burst counter 60 initiates the burst write cycle. Column address buffer 62 receives the output of the burst counter 60 and provides the current column address to column decoder 64. Column decoder 64 activates four of the 1,024×4 lines to sense amplifiers and I/O gating circuits 66 and 68 corresponding to the column address to indicate where the incoming four bit byte of data is to be stored in either bank 0 memory array 22 or bank 1 memory array 24.

During WRITE command operations data is provided on input/output pins DQ1–DQ4 to data-in buffer 30. Data in buffer 30 provides the input write data to a latch 70 corresponding to bank 0 memory array 22 and a latch 72 corresponding to bank 1 memory array 24. The four bit byte of input write data is provided from latch 70 or 72 to the selected bank memory array with sense amplifiers and I/O gating circuits 66 or 68 in a manner known in the art based on the activated four lines corresponding to the current column address.

During a burst write operation of length four, the first byte of data is stored at the memory array location addressed by the column address stored in column address latch 56. Similar to the read burst operation, during the next three clock cycles, burst counter 60 counts up from the column address stored in column latch 56, as defined by the sequence type, to "burst" or clock in the data to be stored in the next three memory locations. A full page burst will wrap around and continue writing data until terminated by the BURST TERMINATION command, PRECHARGE command, or until interrupted with another burst operation.

The burst read and write operation are controlled by the burst mode defined in mode register 40 which is programmable during the SET MODE REGISTER command. The burst operation provide for a continuous flow of data from or to the specified memory array location during read or write access. Burst lengths of two, four, eight, or full page (1,024) cycles are programmable into mode register 40 in one embodiment of SDRAM 20. In one embodiment of the present invention, a burst read/single write mode permits a write operation to be a burst length of one and yet allows the read operation to be the programmed burst length as defined in mode register 40.

In addition, a burst sequence is a programmable feature programmed into mode register 40 during the SET MODE REGISTER command. Typically two types of burst sequences are available for selection including a sequential sequence or an interleaving sequence. The sequential sequence bursts through sequential column locations in the row being accessed in one of the two bank memory arrays. The interleaving sequence follows a set pattern which does not necessarily burst through sequential column locations in the row being accessed. In one embodiment of SDRAM 20, both the sequential and interleaving sequences support bursts of two, four, and eight cycles. In this one embodiment, the sequential sequence supports full page length burst cycles.

Command controller initiates a valid PRECHARGE command with the CS*, WE*, and the RAS* signals low and the CAS* signal high on the positive going edge of the CLK signal. The PRECHARGE command operation deactivates and precharges the bank memory array selected by the state of the BA signal at the time the PRECHARGE command is initiated. In this way, the row previously accessed is deactivated and precharged so that row may be refreshed or another row accessed. Once a bank memory array has been precharged, that bank memory array is in an idle state and must be activated prior to another READ command or WRITE command being issued to that bank memory array. In the preferred embodiment of the SDRAM 20, multiple READ and WRITE commands do not require precharging between each command provided the same row is being accessed.

In a preferred embodiment of SDRAM 20, the PRECHARGE command allows either one or both banks to be precharged. Individual bank precharging is performed if the value on address input pin A10 is registered low at the time the PRECHARGE command is initiated. During individual bank precharging, the state of the BA signal defines which bank is precharged. Both banks are precharged when A10 is registered high at the time the PRECHARGE command is initiated. If A10 is registered high at the time the PRECHARGE command is initiated, BA is treated as a "don't care."

An AUTO REFRESH command is initiated by registering CS*, RAS* and CAS* low with WE* high. The AUTO REFRESH command is preferably employed while operating SDRAM 20. The AUTO REFRESH command is nonpersistent, and therefore must be issued each time a refresh is required.

Addressing is generated by internal refresh controller 34 and refresh counter 38 in a known manner. Thus, the A0–A10 address inputs are treated as "don't care" conditions during an AUTO REFRESH command. In one embodiment of the SDRAM 20 having 4096 rows, all 4,096 rows need to be refreshed every 64 ms. Therefore, providing a distributed AUTO REFRESH command every 15.625 microseconds meets this refresh requirement and ensures that each row is refreshed. A non-preferred alternative form of refreshing is accomplished by issuing all 4,096 AUTO REFRESH commands in a burst at a minimum cycle rate every 64 ms.

A SELF-REFRESH command is initiated by registering CKE, CS*, RAS*, and CAS* low with WE* high. Note that the command input signals are identical to an AUTO REFRESH command except that CKE is disabled. Once the SELF-REFRESH command is registered, all the inputs to SDRAM 20 become "don't cares" with the exception of CKE, as CKE must remain low.

Once SELF-REFRESH mode is engaged with the SELF-REFRESH command, SDRAM 20 provides its own internal clocking to cause it to perform its own AUTO REFRESH operations. The internal clocking is performed by self oscillator and timer 36. In this way SDRAM 20 can remain in SELF-REFRESH mode for an indefinite period. Like during the AUTO REFRESH mode, the addressing during SELF-REFRESH mode is performed with refresh controller 34 and refresh counter 38.

To exit SELF-REFRESH mode, the system clock must be stable prior to CKE going high. Once CKE transitions to high, SDRAM 20 must have NOP commands issued for an amount of time required for completion of any bank memory array being internally refreshed.

During any ACTIVE, READ, WRITE, or PRECHARGE command the bank memory array to be accessed is determined by the registering of the BA signal at the initiation of the command. Bank 0 memory array 22 is selected if the value of the BA signal is registered low and bank 1 memory array 24 is selected if the value of the BA signal is registered high. As described above, the BA signal determines the selection of one of the banks during a PRECHARGE command only when the value on input pin A10 is low. If the value on input pin A10 is high during the PRECHARGE command, BA becomes a "don't care."

When a row of a selected bank memory array is selected with an ACTIVE command that row of the bank memory array becomes activated and continues to remain active until a PRECHARGE command to that selected bank memory array is issued. In other words, the RAS* signal is only registered once externally, but an internally generated RAS* signal to the selected bank memory array remains active until a PRECHARGE command is provided. READ and WRITE commands do not necessarily require a PRECHARGE command to follow the command, but a bank memory array must be precharged prior to registering a new row address. When selecting a row within a bank memory array, the other bank memory array can remain active to permit READ and WRITE commands to interleave between the two bank memory arrays.

Precharging a bank memory array can, in most cases, be hidden due to the dual bank structure of SDRAM 20. To hide the precharging, a PRECHARGE command is issued to the bank memory array not being accessed while the bank memory array being accessed is in a burst mode.

During read operations within the same bank, much of the precharge $T_{RP}$ time can still be hidden when transitioning from one row to another. The PRECHARGE command may be initiated up to one clock cycle prior to the last data-out during a read operation, provided that the read latency is two or more clocks. When the read latency is one clock, the PRECHARGE command may only be issued when the final data-out is available. In any case, at least one clock cycle of the precharge time tap must occur during the cycle the last data-out is being held valid. That is, one of two or two of three clock cycles of the precharge time may be hidden provided the read latency is two or more. Otherwise, only one precharge clock may be hidden.

WRITE commands require a write recovery time ($t_{WR}$) from the last data-in element to the beginning of the PRECHARGE command when the same bank memory array is going from a write command to a PRECHARGE command.

An AUTO-PRECHARGE command is a non-persistent feature in SDRAM 20 which performs all of the same individual bank precharge functions described above for the PRECHARGE command. The AUTO-PRECHARGE command feature of the preferred embodiment of SDRAM 20, permits a user to program a READ command or WRITE command that automatically performs a precharge upon the completion of the READ command or the WRITE command.

By using the AUTO-PRECHARGE command feature, a manual PRECHARGE command does not need to be issued during the functional operation of SDRAM 20. The AUTO-PRECHARGE command insures that the precharge is initiated at the earliest, valid stage within a burst cycle. The user is not allowed to issue another command until the precharged time ($t_{RP}$) is completed. Therefore, when an AUTO-PRECHARGE command is employed in SDRAM 20, the selected bank memory array must not be accessed again until $t_{RP}$, is complete. For example, if a read of two cycles is selected and three clock periods are required to satisfy $t_{RP}$ the bank memory array cannot be accessed during the two clocks following the completion of a burst operation. If a burst of four is programmed and three clock periods are required to satisfy $t_{RP}$, the bank memory array cannot be accessed during the one clock cycle following the completion of the burst, provided that the read latency is two or more clocks, otherwise, the bank memory array cannot be accessed during the two clocks following the completion of the burst cycle.

Write operations require the write recovery time ($t_{WR}$) from the last data-in element to the beginning of the PRE-CHARGE command when the same bank memory array is being accessed. Thus, the bank memory array cannot be reaccessed until $t_{WR}+t_{RP}$ from the last data-in element.

The read latency is a programmable feature of SDRAM 20 defined in mode register 40 during the SET MODE REGISTER command. For example, read latencies of one, two, or three clock cycles are available in the Micron Technology, Inc. MT48LC4M4R1 S 4 MEG×4 SDRAM, and read latencies of two and three clock cycles are available in the Micron Technology, Inc. MT41LC256K32D4(S) 256K×32 SGRAM. The read latency guarantees at which clock the data will become available regardless of the system clock rate. Data can be made available on the input/output pins DQ1–DQ4 up to one clock cycle less than the read latency, depending on the frequency of the system clock. A read latency of two clock cycles programmed with a cycle rate which is greater than the minimum access time will provide data almost immediately after the first clock cycle.

A no operation (NOP) command can be provided to SDRAM 20 to prevent other unwanted commands from being registered during idle or wait states.

Figure 2:
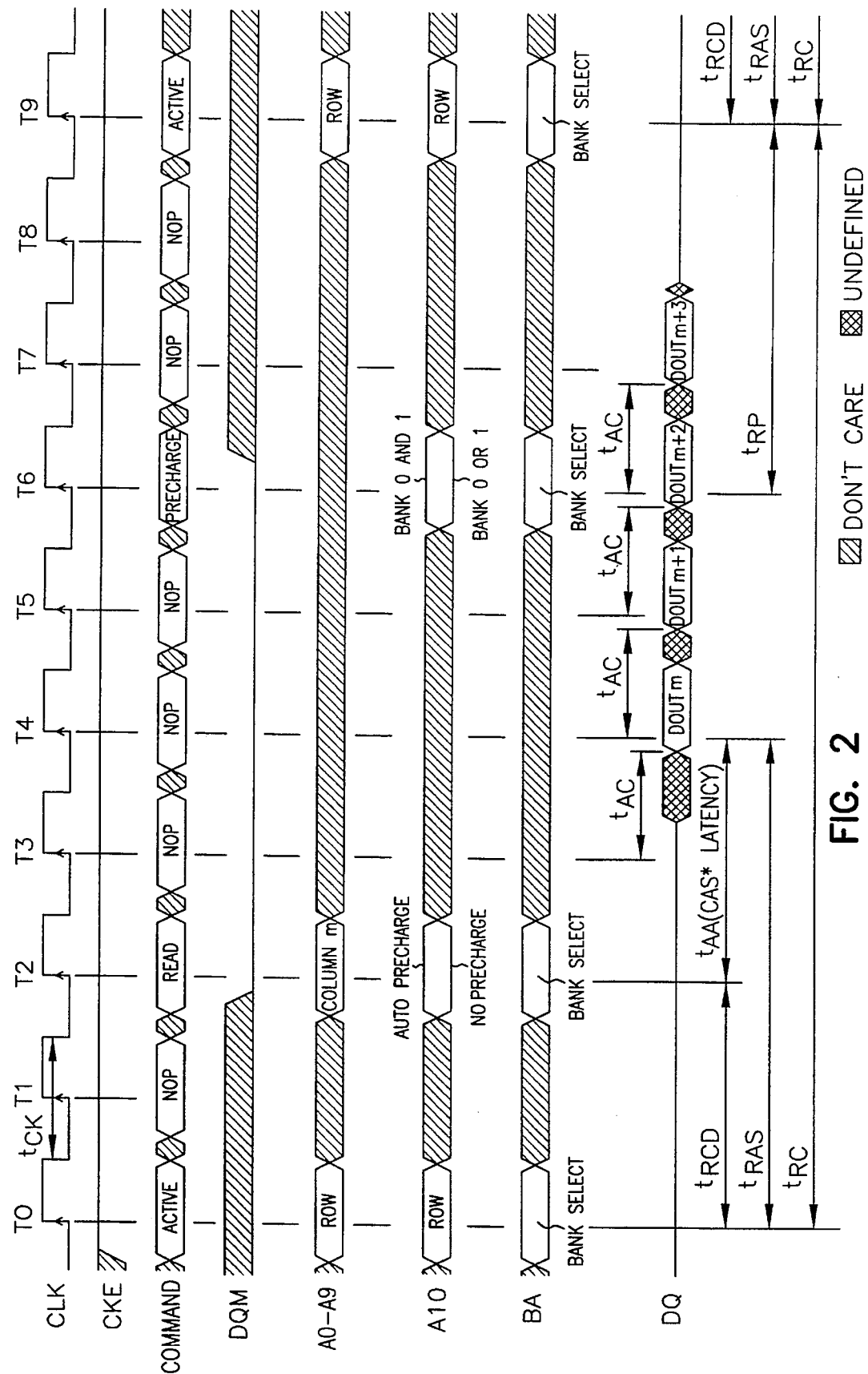
FIG. 2 is a timing diagram illustrating a four cycle read burst transfer operation.

A four cycle burst read operation is illustrated in timing diagram form in FIG. 2. As illustrated, the system clock cycle time is indicated by $t_{CK}$. The time from the initiation of an ACTIVE command to the initiation of a READ command is representing by $t_{RCD}$ and represents two clock cycles, such as between time T0 and time T2. The total read burst transfer cycle period is represented by $t_{RC}$ and represents nine clock cycles as illustrated in FIG. 2. The total ACTIVE command period, wherein the row address strobe is active, is represented by $t_{RAS}$, and represents four clock cycles as illustrated in FIG. 2. The READ access time for each cycle burst in represented by $t_{AC}$. The time from the initiation of the READ command to the DQ clock first data-out cycle is represented by $t_{AA}$ and indicates the column address strobe latency period (the programmed read latency) and is two clock periods as illustrated in FIG. 2. The PRECHARGE command period ($t_{RP}$) is three system clock cycles as illustrated in FIG. 2.

As illustrated in FIG. 2, an ACTIVE command is initiated by command controller 28 at time T0; the corresponding READ command is initiated at time T2; the first cycle burst of data is output at time T4; and the last of the four cycle data bursts is output at time T7. At time T6, a PRECHARGE command is initiated when the second to last data burst is output, and the next ACTIVE command is initiated at time T9, three clock cycles after the PRECHARGE command at time T6.

Figure 3:
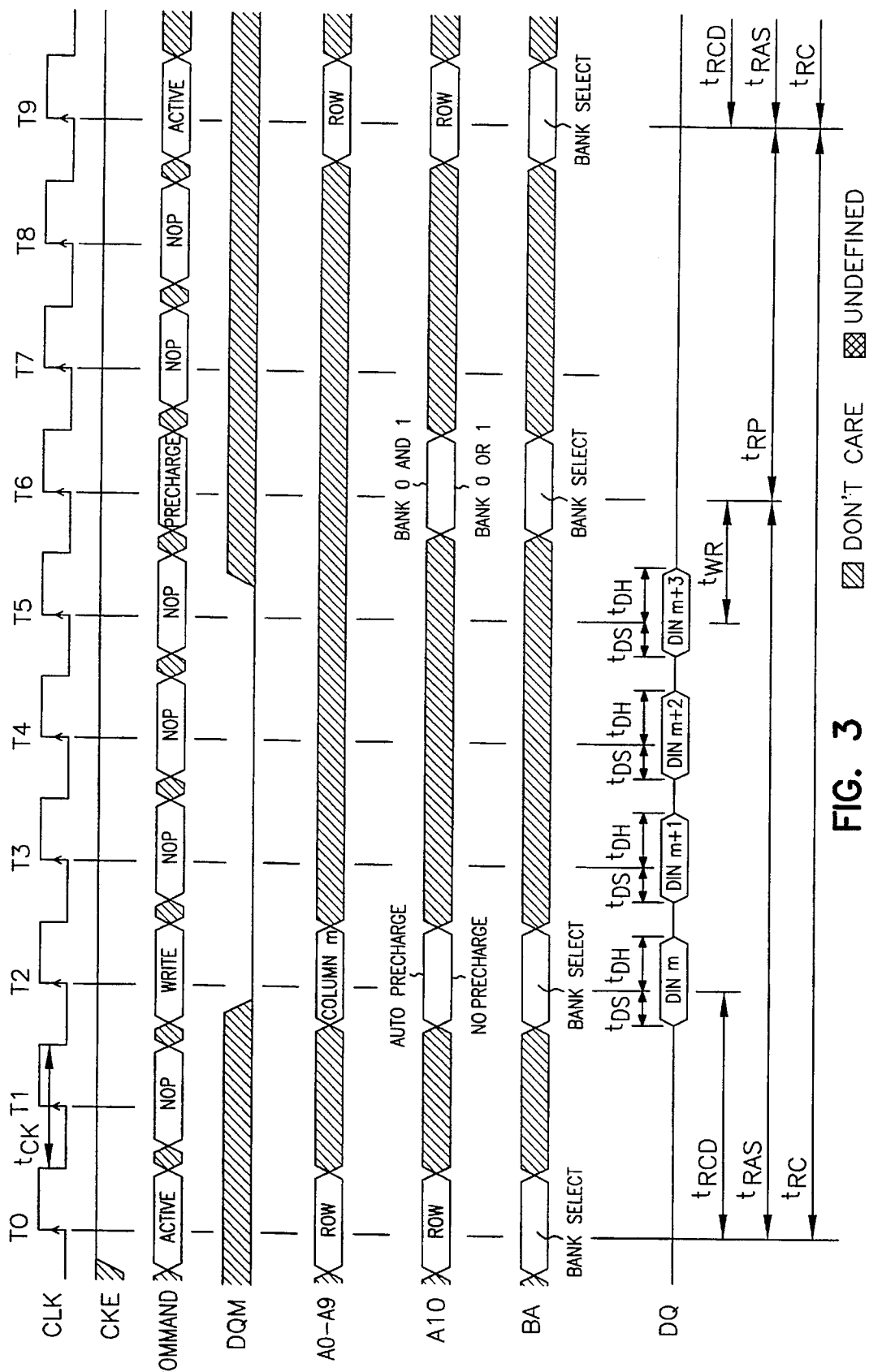
FIG. 3 is a timing diagram illustrating a four cycle write burst transfer operation.

A four cycle burst write transfer operation is illustrated in timing diagram form in FIG. 3. The timing diagram of FIG. 3 is similar to the timing diagram of FIG. 2 illustrating the four cycle burst read transfer operation. Therefore, only the differences between the WRITE and READ commands are now described. During a WRITE operation, the data-in setup time is represented by $t_{DS}$, and the data-in hold time is represented by $t_{DH}$. The write recovery time is indicated by two, which represents one clock cycle, for illustrative purposes, in FIG. 3 between T5 and T6. Thus, as illustrated in FIG. 3, one clock cycle is greater than $t_{WR}$. In many implementations, $t_{WR}$ is greater than one clock cycle, and must extend to cover two clock cycles.

The time from when the WRITE command is initiated at T2 to when the write recovery time is completed after four data bursts have been written into one of the bank memory arrays represents four clock cycles as illustrated in FIG. 3 between T2 and T6. Thus, as with the four cycle read burst transfer operation, the total command period ($t_{RC}$) is again equal to nine clock cycles for the four cycle write burst transfer operation.

Both FIGS. 2 and 3 represent a four cycle burst transfer operation, but as described above SDRAM 20 preferably can be programmed to perform 2, 4, 8, or full page cycle burst operations and the present invention is not limited to a four burst transfer operation.

Figure 4:
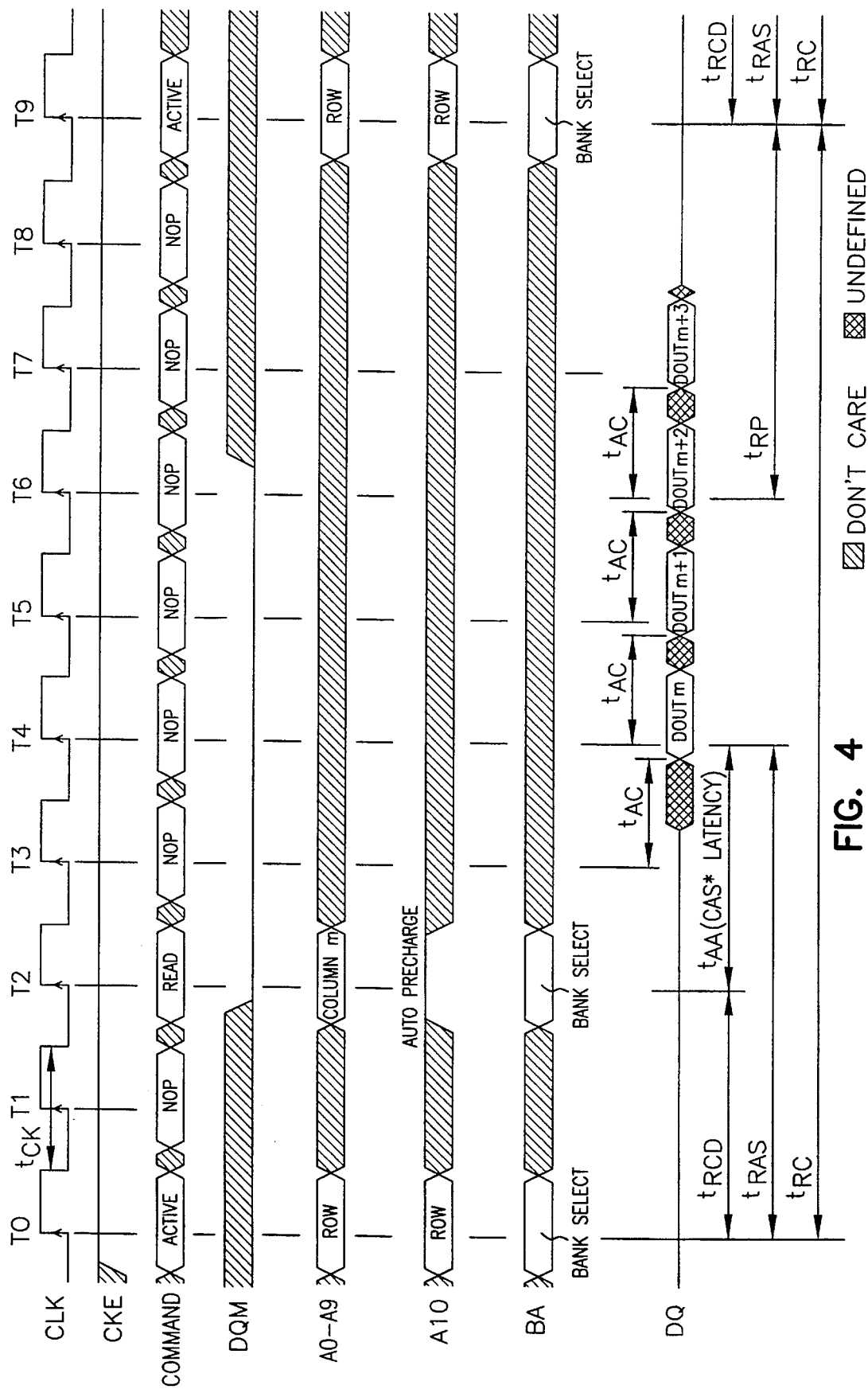
FIG. 4 is a timing diagram illustrating a four cycle read burst transfer operation implementing an AUTO-PRE-CHARGE command following a READ command.

A four cycle read burst transfer operation which utilizes a programmed READ command which automatically issues an AUTO-PRECHARGE command without having to issue and an actual PRECHARGE command is illustrated in FIG. 4 in timing diagram form. FIG. 4 is similar to FIG. 2 except at time T6 a NOP command is issued rather than the PRECHARGE command since at time T6 the AUTO-PRE-CHARGE command is internally performed. A similar modification could be made to FIG. 3 to illustrate an AUTO-PRECHARGE command following a WRITE command.

In SDRAMs or SGRAMs, a read burst operation can follow or truncate a fixed-length write operation, provided that the AUTO-PRECHARGE command was not activated. In addition, a full-page write burst operation can be truncated with a subsequent read burst operation. Once the READ command is registered, the data-inputs are ignored, and further writes are not executed.

Figure 5:
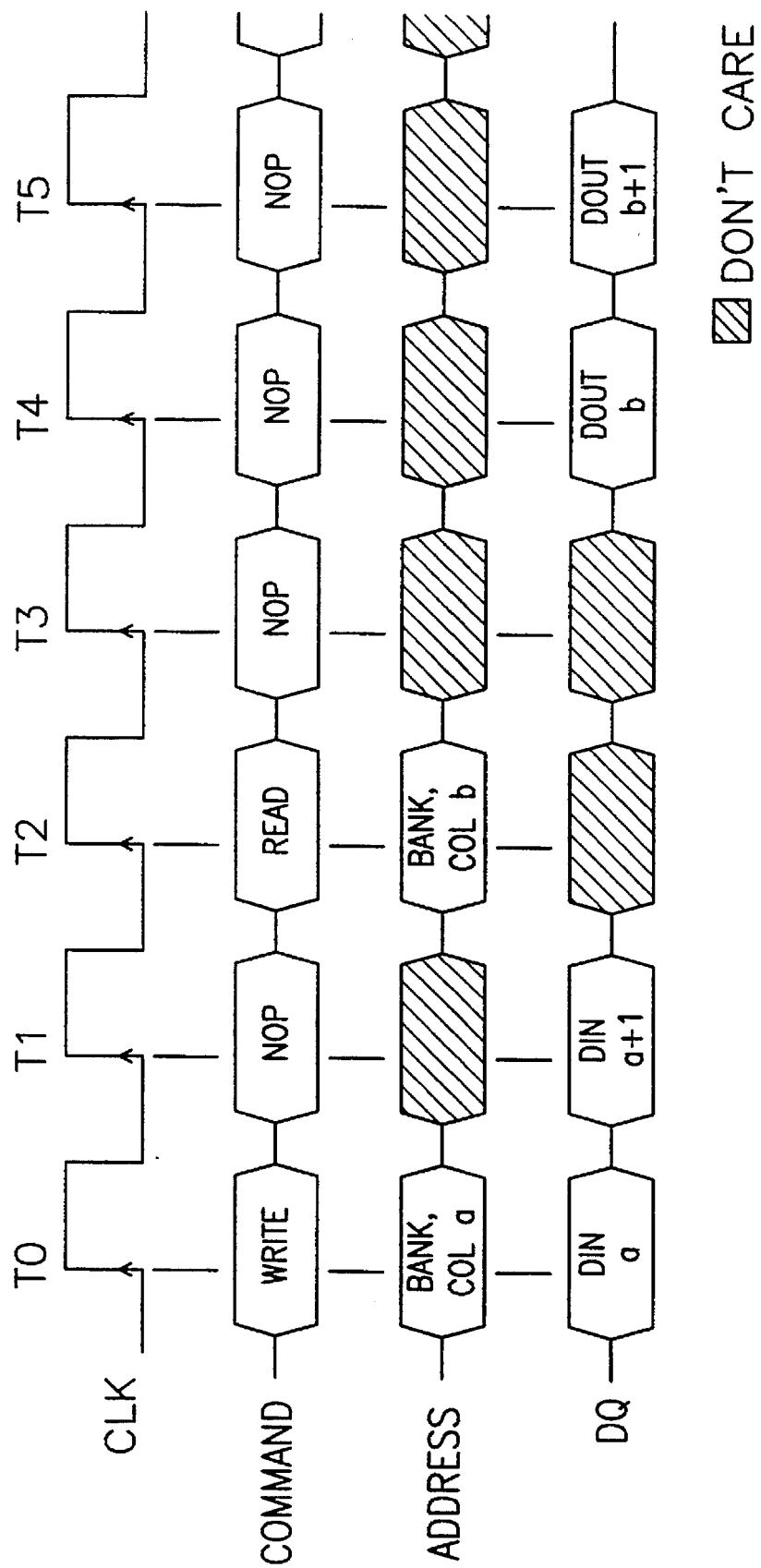
FIG. 5 is a generalized timing diagram illustrating a transition from a write operation to a read operation in a SDRAM or SGRAM according to the present invention programmed with a read latency of two clock cycles.
Figure 6:
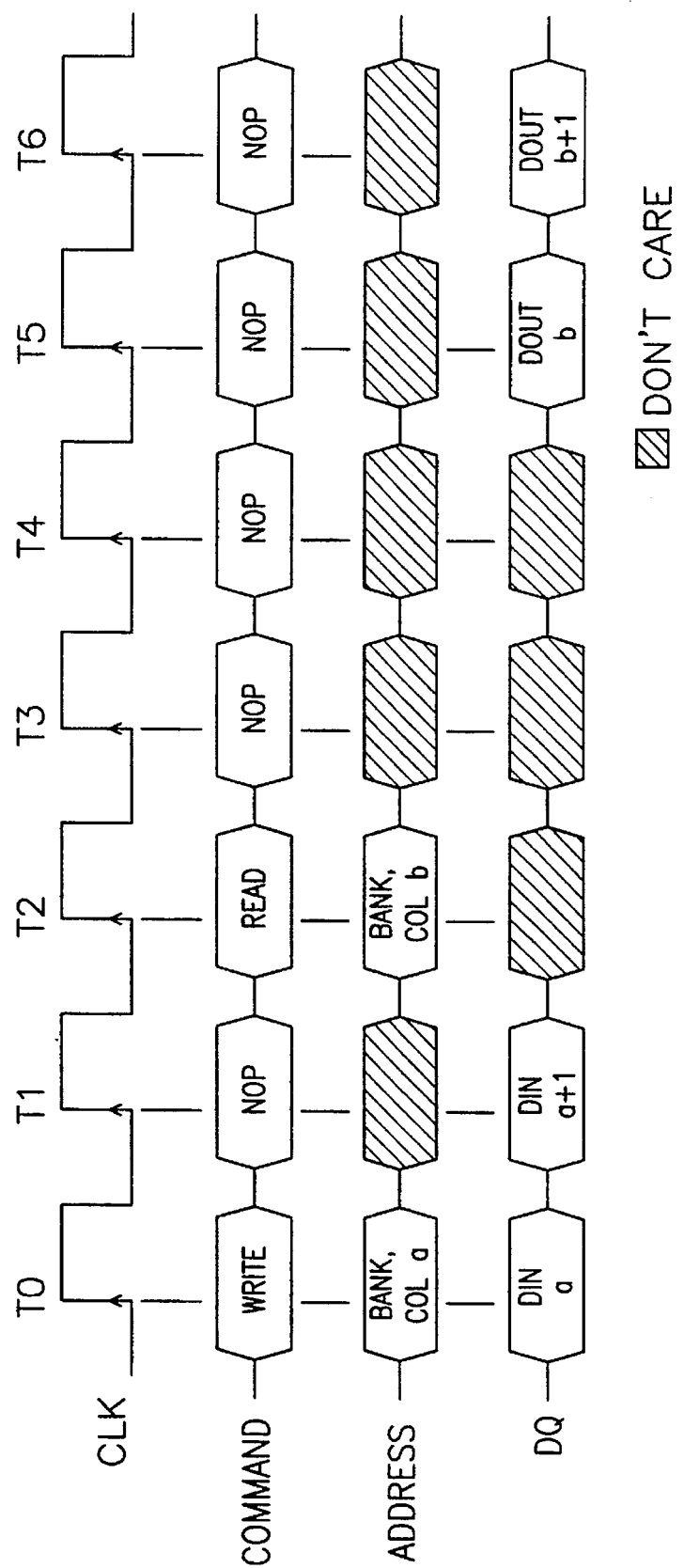
FIG. 6 is a generalized timing diagram illustrating a transition from a write operation to a read operation in a prior art SDRAM or SGRAM programmed with a read latency of three clock cycles.
Figure 7:
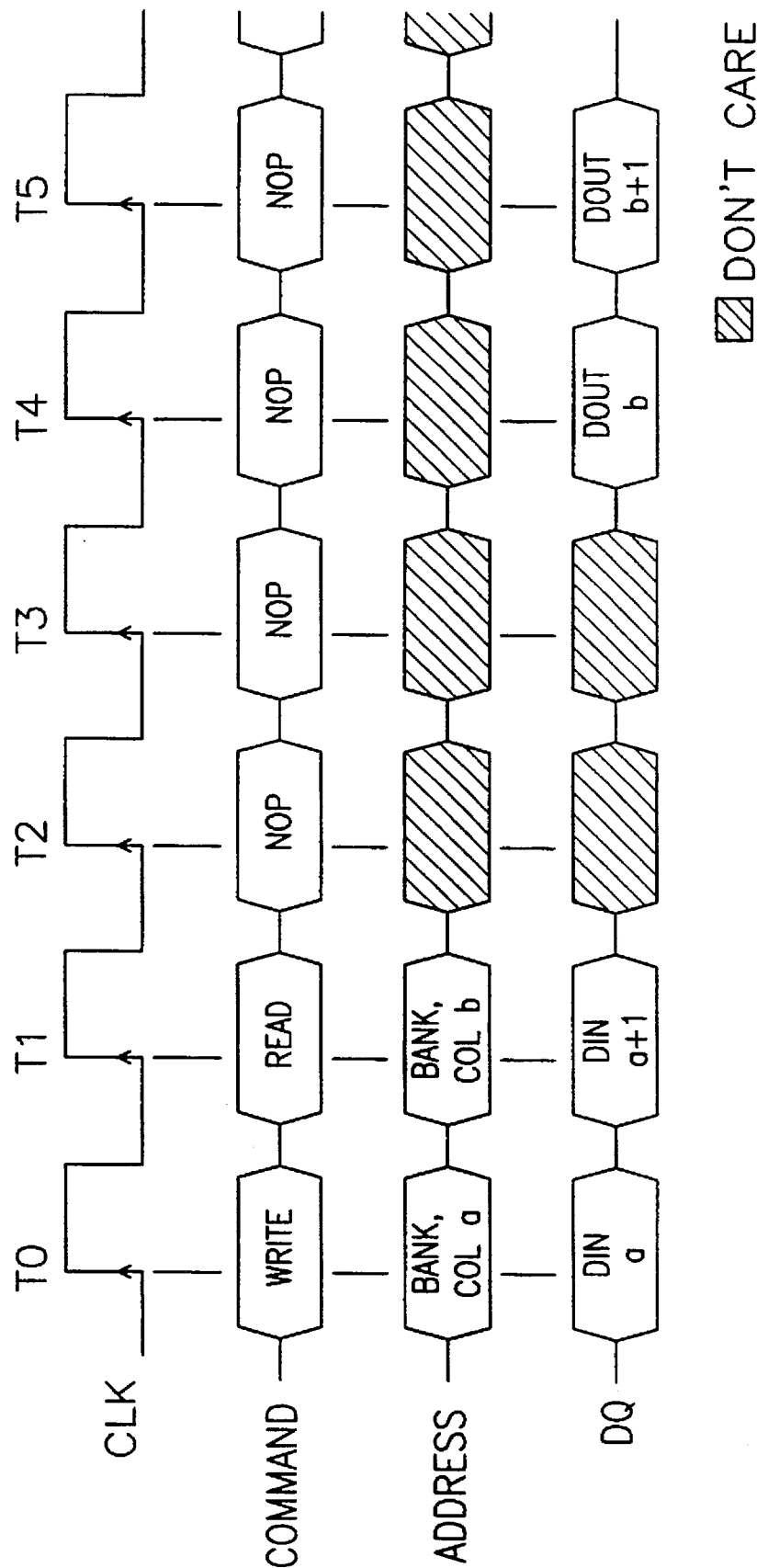
FIG. 7 is a generalized timing diagram illustrating a transition from a write operation to a read operation in a SDRAM or SGRAM according to the present invention programmed with a read latency of three clock cycles.

FIGS. 5–7 illustrate, in timing diagram form, transitions from a write burst operation to a read burst operation. FIGS. 5–7 are generalized to apply to either a SDRAM or a SGRAM, such as SDRAM 20 described above. In addition, the timing diagrams of FIGS. 5–7 cover the situation where a write operation and a read operation are both performed on an active row in a given bank and the situation where the write operation is performed on an active row in one bank and the read operation is performed on an active row in a different bank. In FIGS. 5–7, the input data set (DIN a+1) and the output data set (DOUT b+1) represent the last data set of a burst of two operation, or the last data set desired of a longer Burst Operation. Thus, FIGS. 5–7 show only DIN a and a+1 and DOUT b and b+1 for illustrative purposes, and could be shown for any length burst including full page. Although not shown in FIGS. 5–7, the DQM signal(s) is active (a low-logic level) prior to T0 and remains low through the last clock cycle shown.

FIG. 5 illustrates, in timing diagram form, an example of a transition from a write burst operation to a read burst operation in a SDRAM or SGRAM programmed with a read latency of two clock cycles. As illustrated, when a burst write operation is followed by a READ command to initiate a read operation, a NOP command must be asserted during the transferring of the last data set of the burst write operation prior to issuing the READ command. For example, for a write operation having a burst length of two, the NOP command produces a dead cycle or wait cycle between the WRITE command issued at time T0 and the READ command issued at time T2. Because of the read latency of two, the first output data set (DOUT b) is provided at time T4. This operation of a SDRAM or SGRAM according to the present invention programmed with a read latency of two is similar to the operation of previous SDRAMs and SGRAMs programmed with a read latency of two in that the READ command cannot be issued until after the last data set of the burst write operation has been input on the DQ pins.

A WRITE to READ transition in a prior art SDRAM or SGRAM programmed with a read latency of three clock cycles is illustrated in timing diagram form in FIG. 6. As illustrated, in prior art SDRAMs and SGRAMs, a NOP command must be asserted during the transferring of the last data set of the burst write operation prior to issuing the READ command. For example, for a write operation having a burst length of two, the NOP command produces a dead cycle or wait cycle between the WRITE command issued at time T0 and the READ command issued at time T2. Because of the read latency of three, the first output data set (DOUT b) is provided at time T5.

A WRITE to READ transition in a SDRAM or SGRAM according to the present invention, such as SDRAM 20 described above, programmed with a read latency of three is illustrated in FIG. 7 in timing diagram form. As illustrated, in the SDRAM and SGRAM according to the present invention, a NOP command is not asserted during the transferring of the last data set of the burst write operation. Instead, the READ command is asserted one clock early during the transferring of the last data set of the burst write operation. For example, for a write operation having a burst length of two, the READ command is issued at time T1 immediately after the WRITE command issued at time T0. Because of the read latency of three, the first output data set (DOUT b) is provided at time T4. FIG. 7 illustrates a read latency of three clock cycles, where READ command is asserted during the transferring of the last data set during the write operation. In other embodiments of the present invention accommodating read latencies greater than three, the READ command can be asserted prior to the transferring of the last data set during the write operation. For example, when the read latency number is four clock cycles, the READ command can be asserted during the transferring of the last or second to last data set during the write operation.

SDRAM 20 according to the present invention includes a special program option programmed into mode register 40 during the SET MODE REGISTER command to permit the user of SDRAM 20 to issue an early READ command, which is then properly interpreted and controlled by command controller 28. The special program option in mode register 40 is used to reduce and improve the time required to transition form burst write operations to read operations with read latencies of three or more.

Thus, in contrast to the prior art SDRAM or SGRAM illustrated in FIG. 6, the SDRAM or SGRAM according to the present invention allows the READ command to be issued during the inputting of the last data set of the burst write operation on the DQ pins to thereby eliminate a dead cycle or wait cycle. As illustrated in FIG. 7, by asserting the READ command at time T1 rather than time T2, the first output data set (DOUT b) is provided at time T4 or one clock earlier than in the prior art SDRAM or SGRAM. Therefore, as illustrated by the timing diagrams of FIGS. 5 and 7, in the SDRAM or SGRAM according to the present invention, the number of clock cycles between inputting the last input data set (DIN a+1) of the write operation and outputting the first output data set (DOUT b) for a programmed read latency of three is the same number of clock cycles as a programmed read latency of two. In other words, the SDRAM or SGRAM according to the present invention performs a WRITE to READ transition for a read latency of three to produce output read data in the same number of clock cycles from the end of the write operation as with a WRITE to READ transition for a read latency of two.

Thus, the present invention speeds up the transition from a burst write operation to a burst read operation for read latencies of at least three. The higher read latencies of three and above, are required to accommodate systems employing SDRAMs or SGRAMs which operate with faster clock frequencies. As systems, such as computer systems, continually speed up their clock cycles, eliminating extra dead cycles or wait cycles for the higher read latencies provides significant performance improvements for reading data immediately after a burst write operation.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A memory device responsive to command signals and operating in synchronization with active edges of a system clock, the memory device comprising:

a memory array having storage cells; and a command decoder/controller responsive to selected command signals to initiate, at a first active edge of the system clock, a burst write command controlling a burst write operation to transfer multiple input data sets to the memory array and to initiate, at a second active edge of the system clock, a read command controlling a read operation to transfer at least one output data set from the memory array, wherein one of the multiple input data sets transferred during the write operation is input into the memory device during a second system clock cycle beginning with the second active edge, and wherein each input and output data set includes at least one bit of data.

2. The memory device of claim 1 further comprising a mode register for storing mode information, wherein the command controller is allowed to initiate the read command at the second active edge of the system clock based on the mode information.

3. The memory device of claim 2 wherein the mode information includes a read latency number, wherein when the read latency number is at least three clock cycles, the command controller is allowed to initiate the read command at the second active edge of the system clock.

4. The memory device of claim 3 wherein when the read latency number is three clock cycles, the one of the multiple input data sets input into the memory device during the second system clock cycle is the last data set transferred during the write operation.

5. The memory device of claim 3 wherein when the read latency number is one or two clock cycles, the command controller is not allowed to initiate the read command until after the second system clock cycle.

6. The memory device of claim 2 wherein the mode register is programmable.

7. The memory device of claim 1 wherein the memory device is a synchronous dynamic random access memory.

8. The memory device of claim 1 wherein the memory device is a synchronous graphic random access memory.

9. A method of initiating a read command in a memory device responsive to command signals and operating in synchronization with active edges of a system clock, the method comprising the steps of:

initiating, at a first active edge of the system clock, in response to selected command signals, a burst write command controlling a burst write operation to transfer multiple input data sets to the memory device, wherein each input data set includes at least one bit of input data; and initiating, at a second active edge of the system clock, in response to selected command signals, a read command controlling a read operation to transfer at least one output data set from the memory device, wherein one of the multiple input data sets transferred during the write operation is input into the memory device during a second system clock cycle beginning with the second active edge, and wherein each output data set includes at least one bit of output data.

10. The method of claim 9 further comprising the step of programming a mode register with mode information, wherein the step of initiating the read command at the second active edge of the system clock is performed based on the mode information.

11. The method of claim 10 wherein the mode information includes a read latency number, wherein the step of initiating the read command at the second active edge of the system clock is performed when the read latency number is at least three clock cycles.

12. The method of claim 11 wherein when the read latency number is three clock cycles, the one of the multiple input data sets input into the memory device during the second system clock cycle is the last data set transferred during the write operation.

13. The method of claim 11 wherein the step of initiating the read command is not performed until after the second system clock cycle when the read latency number is one or two clock cycles.

14. The method of claim 9 wherein the method is performed in a synchronous dynamic random access memory device.

15. The method of claim 9 wherein the method is performed in a synchronous graphic random access memory device.

* * * * *